(12) United States Patent
Wang et al.

(10) Patent No.: US 12,374,553 B2
(45) Date of Patent: Jul. 29, 2025

(54) METHOD FOR APPLYING A CAP LAYER TO PROTECT ELECTRICAL COMPONENTS OF A SEMICONDUCTOR DEVICE FROM E-BEAM IRRADIATION

(71) Applicant: Honeywell International Inc., Charlotte, NC (US)

(72) Inventors: Yong-Fa Alan Wang, McKinney, TX (US); Thuy-Doan Pham, Allen, TX (US)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 434 days.

(21) Appl. No.: 17/929,056

(22) Filed: Sep. 1, 2022

(65) Prior Publication Data
US 2024/0079240 A1    Mar. 7, 2024

(51) Int. Cl.
*H01L 21/225* (2006.01)
*H01L 21/027* (2006.01)
*H01L 23/64* (2006.01)

(52) U.S. Cl.
CPC ...... *H01L 21/2254* (2013.01); *H01L 21/0274* (2013.01); *H01L 21/2253* (2013.01); *H01L 23/647* (2013.01)

(58) Field of Classification Search
CPC ............. H01L 21/2254; H01L 21/0274; H01L 21/2253; H01L 23/647; H01L 21/761; H01L 23/552; H01L 29/84; H10N 30/02; H10N 30/883
See application file for complete search history.

(56) References Cited

U.S. PATENT DOCUMENTS

| | | |
|---|---|---|
| 2008/0254563 A1 | 10/2008 | Hanamaki et al. |
| 2009/0298696 A1 | 12/2009 | Otto et al. |
| 2015/0008544 A1* | 1/2015 | Yazawa ................ B81B 3/0086 257/417 |
| 2019/0383683 A1 | 12/2019 | Ramezani |
| 2020/0240857 A1* | 7/2020 | Kudo ..................... G01L 5/162 |

OTHER PUBLICATIONS

Extended European Search Report Mailed on Feb. 2, 2024 for EP Application No. 23188035, 9 page(s).
M. Olszacki et al., "The effect of parasitic boron doping on P-type piezoresistors," Procedia Chemistry, 1:44-47, (2009).

* cited by examiner

*Primary Examiner* — Eliseo Ramos Feliciano
*Assistant Examiner* — Sophia W Kao
(74) *Attorney, Agent, or Firm* — Alston & Bird LLP (57) ABSTRACT

A fabrication method for protecting an electrical component on a semiconductor device when subjected to exposure to highly energized electrons, such as those emitted during e-beam irradiation, is provided. An example method may include doping one or more lead-out regions providing an electrical connection to the electrical component of the semiconductor device. In addition, the method may further include forming the electrical component to electrically connect to at least one of the one or more lead-out regions by doping the surface of the semiconductor substrate with a second dopant. Further, the method may include forming a protective barrier on the surface of the semiconductor substrate, substantially aligned with the one or more lead-out regions. The method may further comprise creating one or more cap regions substantially covering the entire surface of the semiconductor except for the lead-out regions by doping the surface of the semiconductor with a third dopant.

19 Claims, 7 Drawing Sheets

METHOD FOR APPLYING A CAP LAYER TO PROTECT ELECTRICAL COMPONENTS OF A SEMICONDUCTOR DEVICE FROM E-BEAM IRRADIATION

TECHNOLOGICAL FIELD

Embodiments of the present disclosure relate generally to the fabrication process for semiconductor devices, and more particularly, to providing a protective layer for semiconductor devices exposed to electron beam (e-beam) irradiation.

BACKGROUND

Applicant has identified many technical challenges and difficulties associated with the effect e-beam irradiation may have on the physical properties of a semiconductor device when exposed to an e-beam source. Through applied effort, ingenuity, and innovation, Applicant has solved problems related to the exposure of semiconductor devices to e-beam irradiation by developing solutions embodied in the present disclosure, which are described in detail below.

BRIEF SUMMARY

Various embodiments are directed to an example method for protecting the electrical components of a semiconductor device, particularly when exposed to e-beam irradiation.

In accordance with some embodiments of the present disclosure, an example fabrication method for protecting an electrical component on a semiconductor device is provided. In some embodiments, the method may comprise doping one or more lead-out regions on a surface of a semiconductor substrate using a first dopant, wherein the one or more lead-out regions form a contact point for providing an electrical connection to the electrical component of the semiconductor device. In addition, the method may comprise forming the electrical component to electrically connect to at least one of the one or more lead-out regions by doping the surface of the semiconductor substrate with a second dopant. Further, the method may comprise forming a protective barrier on the surface of the semiconductor substrate, substantially aligning with the one or more lead-out regions. In some embodiments, the method may further comprise creating one or more cap regions by doping the surface of the semiconductor with a third dopant, wherein the one or more cap regions substantially cover the entire surface of the semiconductor except for the one or more lead-out regions.

In some embodiments, the electrical component may be a piezoresistor, wherein a resistance of the piezoresistor changes when the surface of the semiconductor substrate is strained.

In some embodiments, the semiconductor device may further comprise a plurality of electrical components arranged in a Wheatstone bridge circuit.

In some embodiments, the semiconductor device may further comprise a plurality of electrical components, wherein at least one of the plurality of electrical components is a bridge.

In some embodiments, the method may further comprise heating the one or more lead-out regions at a first temperature, wherein the first dopant penetrates from the surface of the semiconductor substrate deeper into the semiconductor substrate. In addition, the method may further comprise heating the electrical component at a second temperature wherein the second dopant penetrates from the surface of the semiconductor substrate deeper into the semiconductor substrate.

In some embodiments, doping the surface of the semiconductor may comprise at least one of ion implantation and/or diffusion.

In some embodiments, the first and second dopants may be of the same type.

In some embodiments, the first and second dopants may be p-type dopants.

In some embodiments, the first and second dopants may be one of boron or gallium.

In some embodiments, the one or more lead-out regions may be doped at a first concentration and the electrical component may be doped at a second concentration, wherein the first concentration is greater than the second concentration.

In some embodiments, the third dopant may be of a different type than the first and second dopant.

In some embodiments, the third dopant may be an n-type dopant.

In some embodiments, the third dopant may be phosphorus or arsenic.

In some embodiments, forming a protective barrier may further comprise applying a layer of photoresist material to the surface of the semiconductor device, exposing the layer of photoresist material using a photomask that substantially aligns with the one or more lead-out regions, and removing the layer of photoresist material from all regions of the surface of the semiconductor device except for the regions of the layer of photoresist material contacting the surface of the one or more lead-out regions.

In some embodiments, the one or more cap regions may not substantially overlap with any one of the one or more lead-out regions.

In some embodiments, the semiconductor substrate further comprises an insulating layer, wherein the insulating layer separates the semiconductor substrate from a semiconductor base.

In some embodiments, the method may further comprise depositing a non-oxidizing film on the surface of the semiconductor substrate, wherein the non-oxidizing film substantially covers the surface of the semiconductor device, except for the lead-out regions, and wherein the non-oxidizing film prevents the protective barrier from forming on the surface of the non-oxidizing film.

In some embodiments, the non-oxidizing film may prevent oxide from forming on the surface of the non-oxidizing film.

In some embodiments, the non-oxidizing film may comprise silicon nitride.

In some embodiments, the non-oxidizing film may be defined coincident with forming a photoresist lead-out mask.

BRIEF DESCRIPTION OF THE DRAWINGS

Reference will now be made to the accompanying drawings. The components illustrated in the figures may or may not be present in certain embodiments described herein. Some embodiments may include fewer (or more) components than those shown in the figures in accordance with an example embodiment of the present disclosure.

DETAILED DESCRIPTION

Example embodiments will be described more fully hereinafter with reference to the accompanying drawings, in which some, but not all embodiments of the inventions of the disclosure are shown. Indeed, embodiments of the disclosure may be embodied in many different forms and should not be construed as limited to the embodiments set forth herein; rather, these embodiments are provided so that this disclosure will satisfy applicable legal requirements. Like numbers refer to like elements throughout.

Various example embodiments address technical problems associated with utilizing semiconductor fabrication processes to protect electrical components on a semiconductor device from e-beam irradiation. As understood by those of skill in the field to which the present disclosure pertains, there are numerous example scenarios in which an electrical component on a semiconductor device may need to be protected from emitted high energy particles, such as those emitted during e-beam irradiation. For example, when a semiconductor device is exposed to e-beam irradiation as a way to neutralize harmful microorganisms in preparation for use as a medical device.

Electrical components are often fabricated using semiconductor manufacturing techniques because these techniques enable manufacturers to develop electrical devices in small form factors and at a reduced cost. One example in which semiconductor manufacturing techniques are utilized to develop an electrical device is in the fabrication of pressure sensors. Many pressure sensors take advantage of the piezoresistive effect to determine the pressure in a measured medium. In general, the piezoresistive effect is a change that occurs in the resistance of a semiconductor when mechanical strain is applied (e.g., pressure). When a semiconductor is deformed due to a mechanical strain, the spacing between atoms in the semiconductor material may also change, changing the bandgap distance for the material. The change in the bandgap may make it easier or harder for electrons to be raised into the conduction band, depending on the nature of the deformation. This change in bandgap distance fundamentally affects the resistivity of the semiconductor material.

A pressure sensor may utilize this effect to determine a pressure in an environment. In some examples, four resistors may be connected in a Wheatstone bridge configuration. An input voltage may be applied at connection points on opposite corners of the Wheatstone bridge and the output voltage may be measured on the two adjacent corners. Based on the output voltage and/or the variation of one or more of the resistors in the Wheatstone bridge configuration, the amount of deflection of the surface and subsequent environmental pressure may be determined.

Due to the desire for a small form factor and low cost, pressure sensors are often manufactured as semiconductor devices. One common use of semiconductor pressure sensors is as a mechanism for measuring the pressure in a patient's intravenous (IV) fluid line. Placing a pressure sensor in an IV fluid line enables medical professionals to monitor the real-time blood pressure of a patient, among other things. To be used as a medical device, these pressure sensors must undergo certain sterilization procedures, such as e-beam irradiation. E-beam irradiation uses an electron beam accelerator to propel highly energized electrons at target devices. The propelled electrons penetrate packaging and targeted medical devices to break the DNA chains of bacteria and other harmful micro-organisms. E-beam irradiation enables sterilization to be performed quickly, at lower temperatures, and with less degradation compared to other sterilization techniques, such as steam sterilization, gamma irradiation, or ethylene oxide exposure.

However, e-beam irradiation can also effect the pressure sensing characteristics of a pressure sensor manufactured as a semiconductor device. In some examples, the semiconductor device may absorb irradiated material, liberating charge carriers which diffuse or drift to a place where they are trapped, such as at the junction of the semiconductor material and the insulating oxide layer. In general, this leads to unintended concentrations of charge and consequently creates parasitic electronic fields. In addition, the electron beam passing through the semiconductor device may generate defects and states which will affect the mobility, lifetime, and effective carrier concentrations within the semiconductor device. These and other anomalies may be created by the absorption of highly energized electrons propelled during the e-beam irradiation process. The anomalies introduced through the e-beam irradiation process may additionally effect the calibration of the semiconductor device, particularly if the calibration of the semiconductor device has occurred before the exposure to e-beam irradiation.

The various example embodiments described herein utilize various techniques to protect the electronic components on a semiconductor device from the effects of e-beam irradiation. For example, in some embodiments, the surface of the semiconductor device may be doped with a doping agent. The doped area, or cap region, may be doped with a doping agent of a type opposite the doping type of the electrical components and matching the doping type of the doped semiconductor substrate. The cap region may provide protection to the electrical components and other regions of the semiconductor device from sterilization techniques, such as e-beam irradiation. The change in carrier concentration inside the cap region may balance the dielectric charges generated during the receipt of highly energized particles during a sterilization process and prevent a change in carrier concentration of the electrical components of the semiconductor device from occurring.

In addition, the cap region may be limited to areas outside of the lead-out region. The lead-out region may be a heavily doped region that provides an electrical conduit between the electrical components and an electrical contact at the surface of the semiconductor device. The lead-out region may be heavily doped to minimize resistance experienced in the lead-out region of the semiconductor device. Localizing the resistive regions to the electrical component, such as a piezoresistor, allows the electrical component to be sensitive to changes in resistive properties due to mechanical strain, such as environmental force. Sensitivity to changes in resistive properties may be especially important for electrical components, such as piezoresistors, that rely on detecting minor changes in the electrical properties of the electrical component to make determinations about the physical environment. In addition, the lead-out region may be more resilient to negative effects from accumulated charge due to e-beam irradiation since the lead-out region may have much higher doping concentrations than the electrical components.

As a result of the herein described example embodiments and in some examples, the reliability and accuracy of semiconductor devices may be greatly improved. In addition, the example embodiments described herein may enable users to subject semiconductor devices, such as pressure sensors containing piezoresistors, to e-beam irradiation in preparation for use as medical devices.

Figure 1:
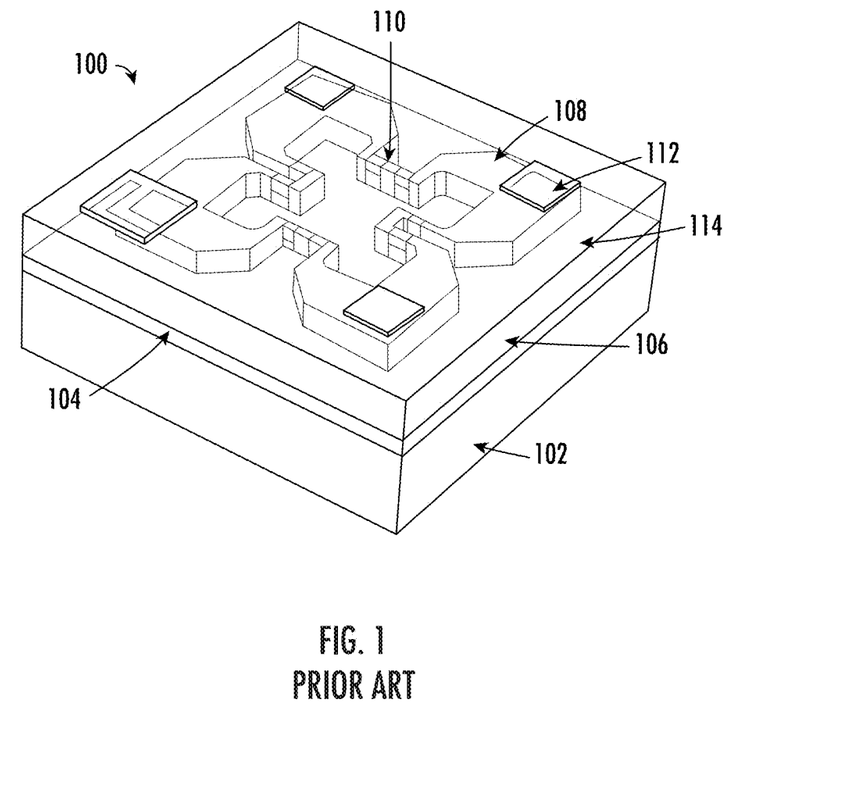
FIG. 1 is a semi-transparent, three-dimensional illustration of a prior art example of a semiconductor device including electrical components, lead-out regions, and electrical contacts.

FIG. 1 illustrates a perspective view of an example prior art semiconductor device 100. The example prior art semiconductor device 100 depicted in FIG. 1 includes a doped substrate 106 separated from a semiconductor base 102 by an insulating layer 104. In addition, the example semiconductor device 100 further includes a lead-out region 108 electrically connecting an electrical component 110 (e.g., piezoresistor) to an electrical contact 112. The surface of the example prior art semiconductor device 100 is further covered by an oxide layer 114. In some embodiments, the oxide layer 114 may isolate the doped substrate 106, electrical component 110, lead-out region 108, and other components of the semiconductor device 100 from air such that the semiconductor properties do not change when the surface of the semiconductor device 100 interacts with the external environment, however, the oxide layer 114 does not protect the underlying structures from penetration from a radiation source, such as e-beam irradiation. In some embodiments, when exposed to highly energized electrons, the oxide layer 114 may liberate charge carriers which diffuse or drift to where they are trapped at the junction of the doped substrate 106 and the oxide layer 114. In general, this leads to unintended concentrations of charge and consequently creates parasitic electronic fields, inhibiting the detection of precise changes in the physical properties of the electrical component 110 due to external forces, such as mechanical strain.

Figure 2:
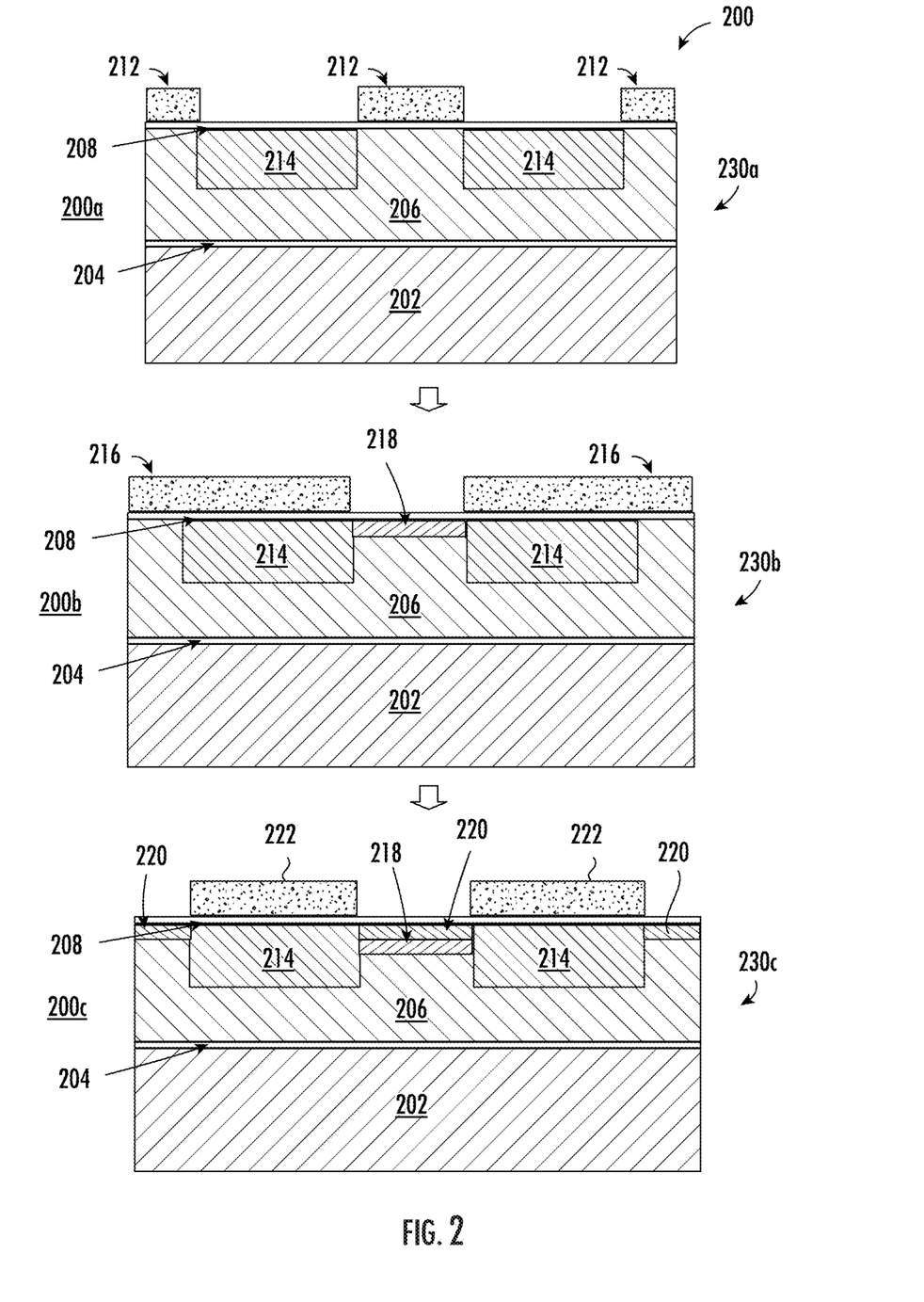
FIG. 2 illustrates an example fabrication process for fabricating a cap layer to protect electrical components on a semiconductor device in accordance with an example embodiment of the present disclosure.

Referring now to FIG. 2, an example cap fabrication process 200 is provided. While the fabrication process may include intermediate steps, the example cap fabrication process of FIG. 2 depicts three states of the semiconductor device (200a, 200b, 200c) in the fabrication of a cap region 220.

As shown in the first depicted state 200a of the cap fabrication process 200, the semiconductor structure 230a includes an insulating layer 204 separating a semiconductor base 202 from a doped substrate 206. As further depicted in state 200a, the semiconductor structure 230a further includes an oxide layer 208 on top of the doped substrate 206 opposite the insulating layer 204. State 200a further depicts a photoresist lead-out mask 212 on top of the oxide layer 208 opposite the doped substrate 206. The example photoresist lead-out mask 212, as depicted in FIG. 2, substantially covers the oxide layer 208 of the semiconductor structure 230a, however, the photoresist lead-out mask 212 contains openings providing access to the surface of the doped substrate 206. The openings in the photoresist lead-out mask 212 define the lead-out regions 214 of the semiconductor structure 230a.

As depicted in state 200a, the example semiconductor structure 230a utilizes silicon on insulator technology. Although depicted utilizing silicon on insulator technology, the semiconductor structure 230a may be fabricated using conventional silicon processes. As depicted in state 200a, the doped substrate 206 is grown on an insulating base (e.g., insulating layer 204). An insulating layer 204 may comprise any insulating material, such as silicon dioxide, synthetic sapphire, or other insulating material. Utilizing an insulating layer 204 may reduce parasitic capacitance and increase the performance of the semiconductor device. In some embodiments, a semiconductor base 202 may be below the insulating layer 204. A semiconductor base 202 may comprise any semiconductor material, including but not limited to silicon, germanium, gallium arsenide, or other similar semiconductor materials. An insulating layer 204 may be created through implantation, wafer bonding, or other similar method.

As further depicted in state 200a, the semiconductor structure 230a includes a doped substrate 206. In some embodiments, during the fabrication process, the semiconductor material in which the electrical structures (e.g., lead-out region 214, electrical component 218, etc.) may be defined may be doped to change the electrical properties of the semiconductor material. In some embodiments, the doping of a semiconductor may be accomplished using a doping agent. A doping agent may be incorporated into the lattice structure of the semiconductor material introducing impurity atoms of a different element than that of the semiconductor material. These impurity atoms may act as either donors or acceptors within the lattice structure of the semiconductor.

Donor atoms provide extra electrons to the semiconductor increasing the semiconductor's electron carrier concentration. A semiconductor that has been doped with a doping agent that introduces extra electrons into the semiconductor structure is referred to as an n-type doping agent, and the semiconductor having a higher electron carrier concentration is referred to as an n-type semiconductor. N-type doping agents increase the conductivity of the semiconductor material by increasing the number of available electrons present in the semiconductor. For a silicon semiconductor, n-type doping agents may be any elements in which the atoms have an additional electron in the valence band, for example Phosphorus.

Acceptor atoms have fewer valence electrons than the atoms they replace in the lattice structure and thus accept electrons from the semiconductor's valence band, creating an excess of holes in the semiconductor structure. A semiconductor that has been doped with a doping agent that introduces an excess of holes, increasing the hole carrier concentration of the semiconductor, is referred to as a p-type semiconductor. The doping agent that introduces the excess of holes is referred to as a p-type doping agent. P-type doping agents increase the conductivity of the semiconductor material by increasing the number of available holes present in the semiconductor. For a silicon semiconductor, p-type doping agents may be any elements in which the atoms have less electrons in the valence band than the semiconductor material, for example Boron or Gallium.

A semiconductor material may be doped with a p-type or n-type doping agent during the growth of the semiconductor material, for example, using vapor-phase epitaxy. A semiconductor material may also be doped during fabrication using photolithography techniques and processes such as diffusion and ion implantation.

Once a substrate material is doped, electrical components may be defined within the doped substrate by doping regions with a doping agent of the opposite type. Thus, the boundaries of the electrical components are defined by p-n junctions confining the current to the electrical components of the semiconductor device. For example, in some embodiments, the doped substrate 206 may be doped using an n-type doping agent, creating an n-type semiconductor. The electrical structures (e.g., lead-out regions 214, electrical components 218, etc.) may then be defined by doping regions of the semiconductor using a p-type doping agent, creating p-type semiconductor components. Thus, electrical flow introduced in the p-type electrical structures may be confined to the p-type regions of the semiconductor device.

As further depicted in state 200a, the semiconductor structure 230a may include an oxide layer 208. In some embodiments, the oxide layer 208 may isolate the doped substrate 206, electrical component 218, lead-out region 214, and other components of the semiconductor device from the external environment. In some embodiments, the oxide layer 208 may prevent change in the semiconductor properties due to interaction with elements in the air, scratching and/or rubbing with other physical surfaces, or other similar interaction with the external environment. The oxide layer 208 may comprise silicon dioxide, silicon nitride, glass, mica, plastic, ceramic, or any other insulating material.

As further depicted in state 200a, the semiconductor structure 230a includes a photoresist lead-out mask 212. The photoresist lead-out mask 212 may be any protective material deposited on the doped substrate 206 and/or oxide layer 208 to define the one or more lead-out regions 214 in the semiconductor material of the doped substrate 206. In some embodiments, the photoresist lead-out mask 212 may be created using photolithographic techniques. For example, a light-sensitive material (e.g., photoresist) may be applied to the surface of the doped substrate 206 such that a thin layer of material covers the entire surface of the doped substrate 206. Portions of the photoresist may then be exposed to light, while other portions of the surface are blocked from exposure by a patterned mask. In a positive photoresist, the portions of the photoresist surface that are exposed to light will be degraded by the light and removed during a development stage. In an instance in which a negative photoresist is used, the portions of the photoresist surface that are blocked from exposure are removed during the development stage. The photoresist material remaining on the surface of the doped substrate 206 after the development stage protects the portions of the doped substrate 206 beneath the photoresist material from subsequent stages of the fabrication process. For example, the portions of the doped substrate 206 beneath the remaining photoresist material may be protected from subsequent doping through implantation and/or diffusion. In addition, protected portions of the doped substrate 206 may be protected from etching through wet etch chemical processes and dry physical or chemical etching processes.

As further depicted in state 200a, the semiconductor structure 230a includes a plurality of lead-out regions 214. A lead-out region 214 may be any region defined in the doped substrate 206 providing an electrical connection from the surface of the semiconductor device to one or more electrical components (e.g., electrical component 218 as shown in state 200b). A lead-out region 214 may be created, in some embodiments, by doping processes, such as ion implantation and/or diffusion. A lead-out region 214 may, in some embodiments, be defined by the position of the photoresist lead-out mask 212 as described above. The lead-out region 214 may be doped with a different type doping agent then the doped substrate 206. For example, the doped substrate 206 may be created using an n-type doping agent to create an n-type semiconductor, subsequently, the lead-out regions 214 may be created using a p-type doping agent to create a p-type semiconductor. Doping the lead-out regions 214 with a different doping agent than the doped substrate 206 creates a p-n junction between the lead-out regions 214 and the doped substrate 206, confining the electric flow introduced to the lead-out regions 214 from the surface of the semiconductor device to the lead-out regions 214 and electrically connected regions of the same doping type (e.g., electrical component 218). In some embodiments, electrical contact points (e.g., electrical contact 112) may be disposed on the surface of the semiconductor device at the location of the lead-out regions 214. These electrical contact points may comprise metal and/or another conductive material and may provide a conductive interface to the lead-out regions 214 from the external environment. In some embodiments, the lead-out regions 214 may be heavily doped compared to the electrical component 218, creating a high carrier concentration in the lead-out regions 214. By heavily doping the lead-out regions 214, the resistance of the lead-out regions 214 is reduced. In some embodiments, the resistance of the lead-out regions 214 may be reduced to increase the sensitivity of the electrical devices (e.g., electrical component 218).

Referring now to state 200b, the photoresist lead-out mask 212 has been removed and the photoresist component mask 216 has been created on the surface of the semiconductor structure 230b. In some embodiments, photoresist (e.g., photoresist lead-out mask 212) may be removed using a photoresist strip process such as chemical stripping and/or plasma etching. Once the photoresist lead-out mask 212 is removed and the surface of the semiconductor is cleaned and/or otherwise prepared for additional fabrication layers, a new mask (e.g., photoresist component mask 216) may be created. In some embodiments, the photoresist component mask 216 may be created through photolithographic processes such as those described in relation to the photoresist lead-out mask 212. The photoresist component mask 216 may define regions in the doped substrate 206 utilized to create electrical components (e.g., electrical component 218). As described in relation to the photoresist lead-out mask 212, the photoresist component mask 216 may protect the covered portions of the surface of the doped substrate 206 from exposure to doping through implantation and/or diffusion, while the exposed portions of the doped substrate 206 may be subject to receipt of doping agents.

As further depicted in state 200b of FIG. 2, the semiconductor structure 230b includes an electrical component 218. An electrical component 218 may be any region defined in the doped substrate 206 comprising a component of the electrical device, for example, a piezoresistor, a resistor, a capacitor, a bridge, and/or other similar electrical component. In some embodiments, a plurality of electrical components 218 may comprise piezoresistors configured in a Wheatstone bridge configuration, forming a Wheatstone bridge circuit. In such an embodiment, the resistance of the piezoresistor (e.g., electrical component 218) may change when subjected to external strain, such as pressure on the surface of the semiconductor device. Such an external strain may deform the electrical component 218, altering the spacing between atoms in the semiconductor material. The change in spacing between atoms may make it easier or harder for electrons to be raised into the conduction band, depending on the nature of the deformation. The change in spacing between atoms subsequently leads to a higher or lower resistance in the electrical component 218. A semiconductor device, such as a pressure sensor, may utilize the piezoresistive effect to determine the force placed on the surface of the semiconductor device and thus the pressure in the measured environment. To maintain sensitivity to small changes in the resistance of the piezoresistor (e.g., electrical component 218), the piezoresistor, in some embodiments, may need to be lightly doped as compared to the lead-out region 214. Thus, measured changes in resistance as electrical current flows into one lead-out region 214, through the electrical component 218, and out another lead-out region 214 may be attributed to changes in the piezoresistor due to strain from external forces.

As depicted in the example semiconductor structure 230b of FIG. 2, the electrical component 218 is connected to an exterior electrical source through a lead-out region 214 on each end of the electrical component 218. An electrical component 218 may be defined, in some embodiments, by doping processes, such as ion implantation and/or diffusion. An electrical component 218 may, in some embodiments, be defined by the photoresist component mask 216 described above. In some embodiments, the electrical component 218 may be doped with a different type doping then the doped substrate 206. For example, the doped substrate 206 may be created using an n-type doping agent to create an n-type semiconductor and the electrical component 218 may be defined using a p-type doping agent to create a p-type semiconductor. Doping the electrical component 218 with a different doping agent than the doped substrate 206 creates a p-n junction between the electrical component 218 and the doped substrate 206, confining the electric flow introduced to the electrical component 218 from the lead-out regions 214 to the electrical components 218 and the lead-out regions 214.

Referring now to state 200c of FIG. 2, the photoresist component mask 216 has been removed and a photoresist cap mask 222 has been created on the surface of the semiconductor structure 230c, defining one or more cap regions 220.

As depicted in state 200c of FIG. 2, the example semiconductor structure 230c includes a photoresist cap mask 222. As described above, in some embodiments, photoresist (e.g., photoresist component mask 216) may be removed using a photoresist strip process and the surface of the semiconductor structure may be prepared for additional fabrication layers. After the photoresist component mask 216 is stripped, a photoresist layer may be re-applied and a photoresist cap mask 222 may be defined using photolithography techniques, such as those described in relation to the photoresist lead-out mask 212.

The photoresist cap mask 222 may define a cap region 220 in which a protective layer of doping may be applied. As depicted in state 200c, in some embodiments, the photoresist cap mask 222 may define a region across the entire surface of the semiconductor structure 230c, except where the lead-out regions 214 are defined. As described in relation to the photoresist lead-out mask 212, the photoresist cap mask 222 may protect the covered portions of the surface of the semiconductor structure 230c from exposure to doping through implantation and/or diffusion, while the exposed portions of the surface of the semiconductor structure 230c may be subject to receipt of doping agents. As shown in FIG. 2, the photoresist cap mask 222 protects the lead-out regions 214 from the cap doping used to create the cap region 220. The photoresist cap mask 222 prevents the cap region 220 from overlapping with the lead-out region 214.

The example semiconductor structure 230c of FIG. 2 further depicts a cap region 220. A cap region 220 may be defined by the photoresist cap mask 222 and created through doping techniques, such as ion implantation and/or diffusion. In some embodiments, the cap region 220 may be created using doping agents of a type opposite the doping type of the electrical components 218, the lead-out regions 214, and other electrical components of the electrical device (e.g., pressure sensor). For example, in some embodiments, the doped substrate may be doped with an n-type doping agent while the electrical components 218 and lead-out region are doped with a p-type doping agent. In such an instance, the cap region 220 may be doped with an n-type doping agent. The cap region 220 may intercept the charged atoms detached during a sterilization process, such as e-beam irradiation, preventing charge build-up in and around the electrical components 218 that may adversely affect the electrical properties of the electrical components 218. In addition, the photoresist cap mask 222 prevents the cap region 220 from overlapping with the lead-out regions 214, preserving the high carrier concentration of the lead-out regions 214. Preventing the cap region 220 from overlapping the lead-out regions 214 enables the lead-out regions 214 to maintain limited resistance, allowing the electrical device to be more sensitive to variations in the resistance of the electrical components 218, such as a piezoresistor. In addition, coverage of the entire surface of the semiconductor device with a cap region, except for the lead-out regions 214 provides protection to all components of the semiconductor device from high energy particles, such as those emitted during e-beam irradiation.

Figure 3:
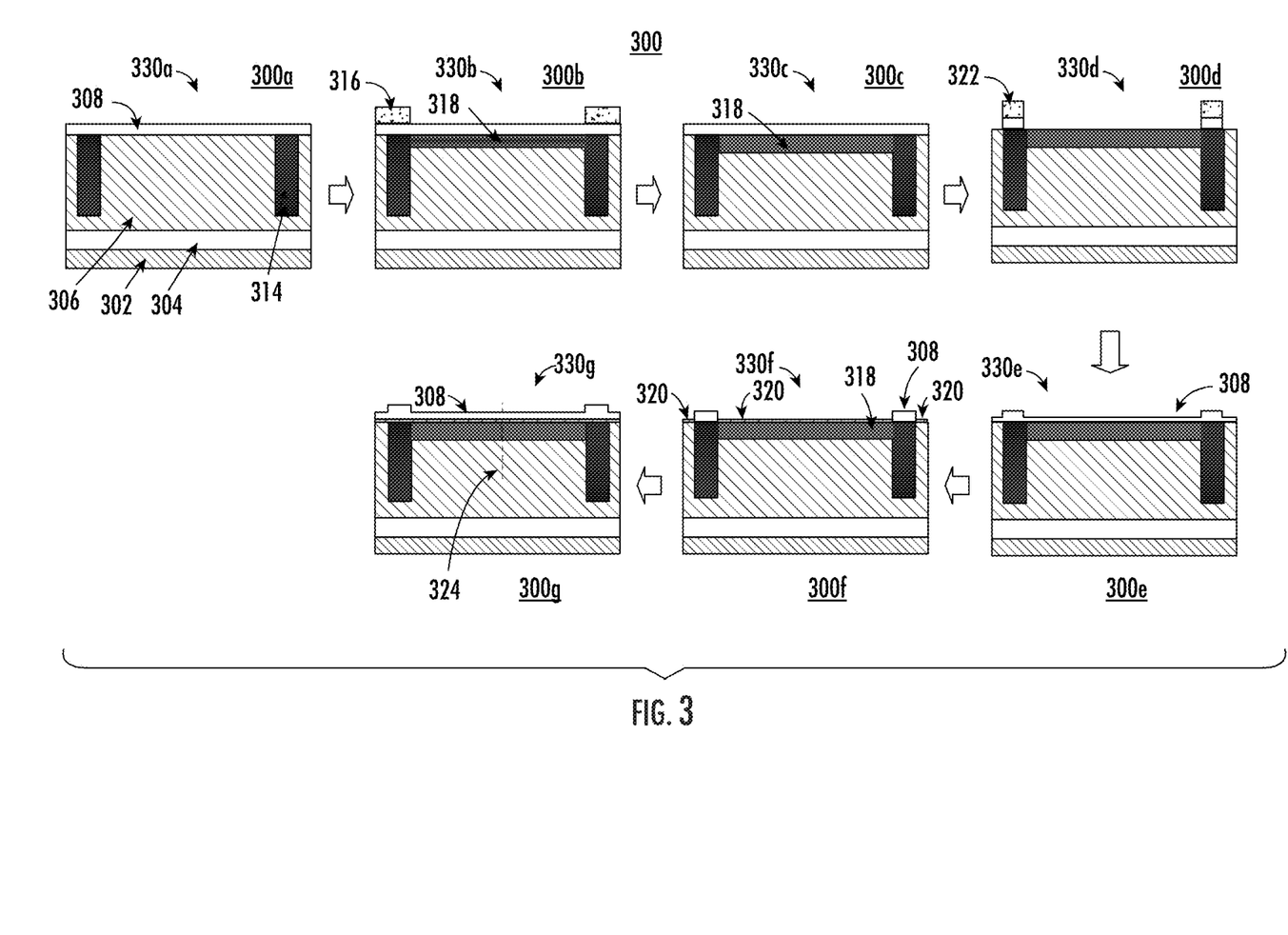
FIG. 3 illustrates another example fabrication process additionally utilizing drive-in techniques in accordance with an example embodiment of the present disclosure.

Referring now to FIG. 3, another example cap fabrication process 300 is provided in accordance with an example embodiment of the current disclosure.

As depicted in step 300a of the example cap fabrication process 300, the semiconductor structure 330a includes a semiconductor base 302, and insulating layer 304, a doped substrate 306, and an oxide layer 308. Further, a plurality of lead-out regions 314 have been defined.

As depicted in step 300b, the semiconductor structure 330b includes a photoresist component mask 316 created to define the doping region for the electrical components (e.g., electrical component 318).

As depicted in step 300c of the example cap fabrication process 300, in some embodiments, a drive-in process may be utilized to increase the depth of the doped components, for example, the lead-out regions 314 and the electrical components 318. In some embodiments, the semiconductor structure (e.g., 330a and 330c) may be heated to induce the drive-in process after a region has been doped.

For example, once the lead-out regions 314 are created through the doping process in step 300a, in some embodiments, the semiconductor structure 330a may be heated to increase the depth of the doping agents. In some embodiments, the semiconductor structure 330a may be heated at a temperature between 1100° C. and 1250° C.; more preferably between 1125° C. and 1225° C.; most preferably between 1150° C. and 1200° C. In some embodiments, the semiconductor structure 330a may be heated for a duration between 30 minutes and 70 minutes; more preferably between 35 minutes and 65 minutes; most preferably between 40 minutes and 60 minutes.

Similarly, in some embodiments, once the electrical components 318 are created through the doping process in step 300c, the semiconductor structure 330c may be heated to increase the depth of the doping agents. In some embodiments, the semiconductor structure 330c may be heated at a temperature between 1000° C. and 1200° C.; more preferably between 1025° C. and 1175° C.; most preferably between 1050° C. and 1150° C. In some embodiments, the semiconductor structure 330a may be heated for a duration between 25 minutes and 55 minutes; more preferably between 30 minutes and 50 minutes; most preferably between 35 minutes and 45 minutes.

As depicted in step 300d of the example cap fabrication process 300, photoresist cap masks 322 may be created on the surface of the semiconductor structure 330d to define the cap region 320. In some embodiments, the oxide layer 308 may be removed from the portions of the semiconductor structure 330d on which the cap doping will be applied. Removing the oxide layer 308 on the cap region 320 may enable a thicker oxide layer 308 to be maintained on top of the lead-out regions 314, as shown in the semiconductor structure 330d of step 300d. The thicker oxide layer 308 over the lead-out regions 314 may act as a barrier to cap doping when the cap region 320 is created.

As depicted in step 300e, a thin oxide layer 308 may be re-grown on the semiconductor structure 330e before the doping for the cap region 320 occurs. In some embodiments, the thin oxide layer 308 may prevent channeling effects during the cap doping phase to create the cap region 320 shown in semiconductor structure 330f. In addition, in some embodiments, the thin oxide layer 308 may prevent metallic contamination of the semiconductor structure 330e during the cap doping phase. In some embodiments, the oxide layer 308 may be thin such that low energy implantation techniques may be utilized to form a shallow cap region 320.

As depicted in step 300f, the semiconductor structure 330f may be exposed to cap doping to create the cap region 320 across the surface of the semiconductor structure 330f, except over the lead-out regions 314. As described in relation to FIG. 2, the cap region 320 may be of a doping type opposite the electrical components 318 and the lead-out regions 314. In addition, as depicted in step 300f, the cap region 320 does not overlap with the lead-out regions 314. In some embodiments, the cap region 320 may be shallow. A shallow cap region 320 may be utilized to minimally interfere with the electrical components 318. For example, in an instance in which the electrical component 318 is a piezoresistor, a shallow cap region 320 may be utilized to maintain the sensitivity of the piezoresistor. In some embodiments, a shallow cap region 320 may continue to between 0.4 microns and 0.8 microns into the semiconductor structure 330f from the surface of the semiconductor structure 330f.

As further depicted in step 300g, in some embodiments, a final oxide layer 308 may be grown atop the full surface of the semiconductor structure 330g. The oxide layer 308 may prevent change in the semiconductor properties due to interaction with elements in the environment, scratching and/or rubbing with other physical surfaces, and other similar external influences.

Figure 4:
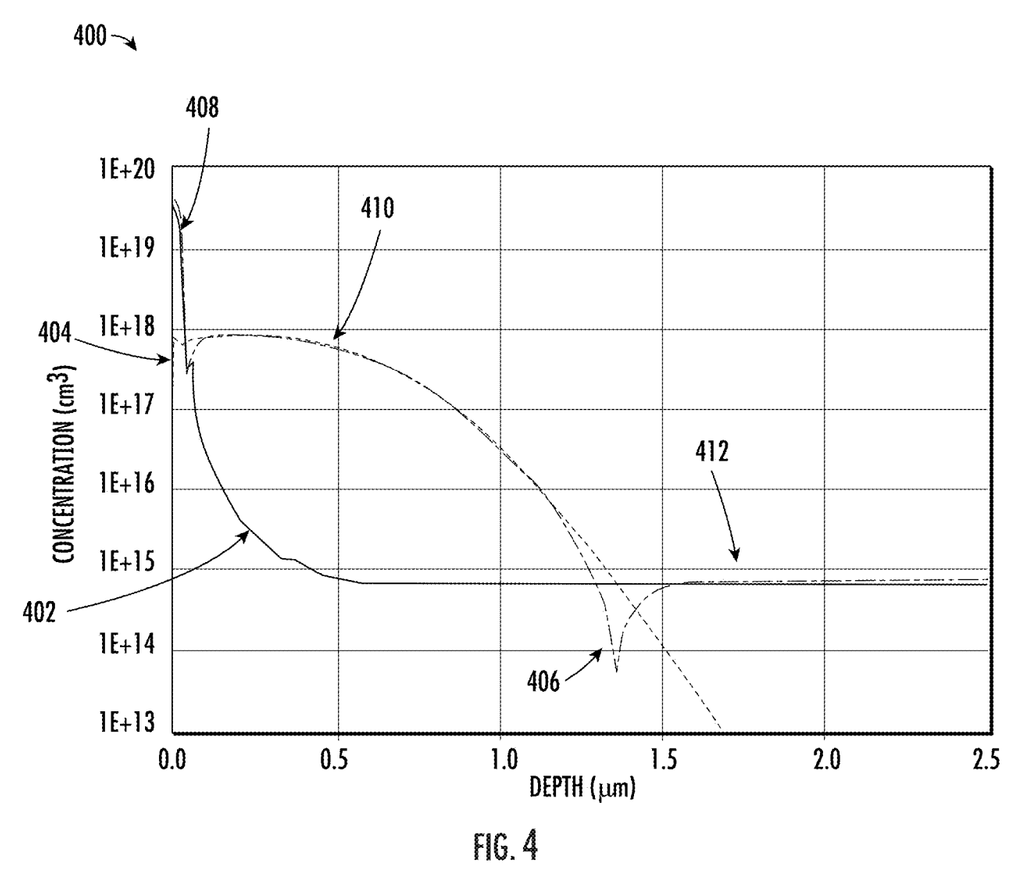
FIG. 4 depicts a graph illustrating concentrations of various dopants and carriers within the semiconductor substrate in accordance with an example embodiment of the present disclosure.

The line 324 shown on the semiconductor structure 330g in the cap fabrication process 300 of FIG. 3 corresponds to the graph 400 depicted in FIG. 4.

Referring now to FIG. 4, a graph 400 depicting the concentrations of doping agents and the carrier concentration as a function of the depth from the surface of the semiconductor structure 330g (as shown in FIG. 3) at line 324, is provided. The y-axis of the graph 400 represents the concentration of the element while the x-axis represents the depth from the surface of the semiconductor structure 330g. As depicted in graph 400, the cap region 320 and the doped substrate 306 are both n-type semiconductors (created with Phosphorus), while the electrical component 318 and lead-out regions 314 are created using a p-type doping agent (Boron), however, in some embodiments, the cap region 320 and the doped substrate 306 may be p-type semiconductors and the electrical components 318 and the lead-out regions 314 may be n-type semiconductors.

The data line 402 represents the concentration of Phosphorus (n-type) in the semiconductor structure 330g at line 324 as a function of the depth from the surface of the semiconductor structure 330g. Areas of high Phosphorus concentration generally correlate with an n-type semiconductor. The data line 404 represents the concentration of Boron in the semiconductor structure 330g at line 324 as a function of the depth from the surface of the semiconductor structure 330g. Areas of high Boron concentration generally correlate with a p-type semiconductor. The data line 406 represents the carrier concentration in the semiconductor structure 330g at line 324 as a function of the depth from the surface of the semiconductor structure 330g. Areas of high carrier concentration due to the presence of extra holes generally correlate with a p-type semiconductor, while areas of high carrier concentration due to the presence of extra electrons generally correlate with an n-type semiconductor.

As shown in the graph 400, the point 408 represents a point within the cap region 320 of the semiconductor structure 330g. Within the cap region 320, the concentration of Phosphorus (n-type doping agent) is significantly greater than the concentration of Boron (p-type doping agent). The concentration of Phosphorus near the surface of the semiconductor structure 330g may shield the underlying electrical components (e.g., electrical component 318) from alteration due to high energy particles such as those emitted during e-beam irradiation, thus preventing charge build-up near the electrical component 318 and alteration of the electrical properties of the electrical component 318. At point 408, the carrier concentration represents available electrons corresponding to the n-type dopant, and thus, the carrier concentration (e.g., data line 406) is also high due to an abundance of free electrons.

As further depicted in graph 400, the point 410 illustrates the relative concentration levels of Phosphorus (e.g., data line 402), Boron (e.g., data line 404), and carriers (e.g., data line 406) at a point within the electrical component 318 of the semiconductor structure 330g. As shown in the graph 400, the concentration of Phosphorus (e.g., data line 402) is significantly less than the concentration of Boron (e.g., data line 404). The concentration of Boron (e.g., data line 404), in some embodiments, may be greater because of a doping process to create an example p-type electrical component 318. The concentration of Phosphorus may be significantly less than at point 408 because the point 410 is below the cap region 320 defined by a higher concentration of n-type dopants.

In addition, at point 410, the carrier concentration represents the concentration of available holes. In the example semiconductor structure 330g, the electrical components 318 and the lead-out regions 314 are defined using p-type dopants and current is transmitted through these electrical structures utilizing available holes. The availability of holes, and thus the carrier concentration, are closely tied with the concentration of p-type dopants in the electrical component 318.

As further depicted in graph 400, the point 412 represents a point below the electrical component 318 and within the doped substrate 306 of the semiconductor structure 330g. In an embodiment in which the doped substrate 306 is an n-type semiconductor, as depicted in graph 400, the concentration of Phosphorus (e.g., data line 402) remains constant, while the concentration of Boron (e.g., data line 404) drops to near 0. The carrier concentration (e.g., data line 406) at point 412 once again represents available electrons associated with the presence of Phosphorus atoms.

Figure 5:
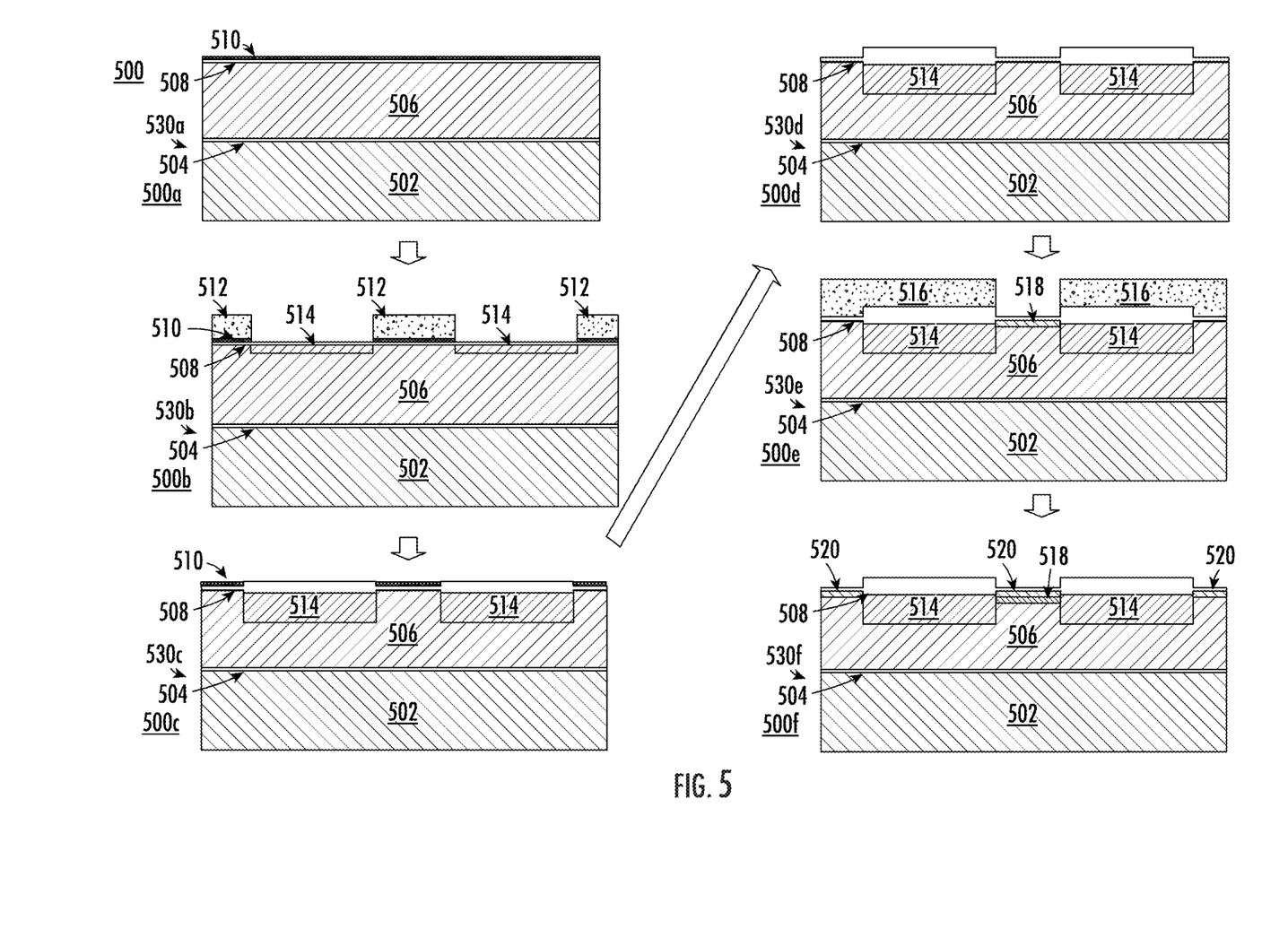
FIG. 5 illustrates another example fabrication process utilizing self-aligning techniques in accordance with an example embodiment of the present disclosure.

Referring now to FIG. 5, an example self-aligning cap fabrication process 500 is provided. As with the semiconductor structure 230a of FIG. 2, the semiconductor structure 530a includes a semiconductor base 502, an insulating layer 504, a doped substrate 506, and an oxide layer 508. However, the semiconductor structure 530a additionally includes a non-oxidizing film (e.g., silicon nitride film 510) disposed on top of the oxide layer 508. In some embodiments, the silicon nitride film 510 may eliminate the need for a masking step requiring precise alignment of the cap region 520 with the lead-out regions 514 when defining the cap region 520. In the self-aligning cap fabrication process 500 of FIG. 5, the silicon nitride film 510 may be deposited on the surface of the semiconductor structure 530a through vapor deposition, sputtering, evaporation, and/or the like.

As shown in step 500b of the example self-aligning cap fabrication process 500, a photoresist lead-out mask 512 is disposed on the surface of the semiconductor structure 530b and etched to define the lead-out regions 514. In some embodiments, the etching process may remove the non-oxidizing film (e.g., silicon nitride film 510) from the surface of the semiconductor structure 530b where the lead-out regions 514 may be created, however, the silicon nitride film 510 may remain on the surface of the semiconductor structure 530b where the cap region 220 may be created. The non-oxidizing film (e.g., silicon nitride film 510) may be any layer that may prevent the formation of the protective barrier, such as oxide layer 508, over all regions of the semiconductor substrate 512, except for where the lead-out regions 514 are formed. Preventing growth of a thick oxide layer 508 over all regions of the semiconductor substrate 512, except the lead-out regions 514, allows the cap region 520 to penetrate the thin portions of the oxide layer 508 and form a cap region 520 on the surface of the semiconductor structure 530b. Step 500b, also shows the creation of the lead-out regions 514 in the regions of the surface of the semiconductor structure 530b exposed to the doping process.

As shown in step 500c of the example self-aligning cap fabrication process 500, the photoresist lead-out mask 512 is stripped from the surface of the semiconductor structure 530c through a photoresist stripping process. The silicon nitride film 510 remains on the entire surface of the semiconductor structure 530c except where the lead-out regions 514 have been defined. After the photoresist lead-out mask 512 is stripped from the surface of the semiconductor structure 530c an additional oxide layer 508 is grown on the surface of the semiconductor structure 530c, however, the oxide layer 508 may not grow on regions covered by the silicon nitride film 510. Thus, the oxide layer 508 is only grown over the lead-out regions 514, increasing the thickness of the oxide layer 508 in those regions. Once the oxide layer 508 is grown over the lead-out regions 514, the silicon nitride film 510 may be stripped, as shown in step 500d. The semiconductor structure 530d depicts a thicker oxide layer 508 over the lead-out regions 514 as compared to the thickness of the oxide layer 508 over the cap region 520.

As described with reference to FIG. 2, and FIG. 3, and shown in step 500e, the electrical components 518 may be created by a similar process involving creating a photoresist component mask 516 on the surface of the semiconductor structure 530e. The photoresist component mask 516 defines the electrical component 518 region on the surface of the semiconductor structure 530e and the electrical component may be created by doping the exposed region of the semiconductor structure 530e.

As shown at step 500f of the example self-aligning cap fabrication process 500, the cap region 520, in some embodiments, may be created without a mask such as the photoresist cap mask (222, 322) of FIG. 2 and FIG. 3. The cap region 520 of the semiconductor structure 530f may be created at step 500f through the standard doping process described in relation to FIG. 2 and FIG. 3. However, because the oxide layer 508 over the lead-out regions 514 may be thicker compared to the oxide layer 508 over the other regions of the surface of the semiconductor structure 530f, the precise location of the cap region 520 can be created without a photoresist cap mask. The doping agents used in the doping process to create the cap region 520 may not penetrate the thicker oxide layer 508 but may be able to penetrate the thinner oxide layer 508 and implant in the semiconductor structure 530f. In addition, because the thicker oxide layer 508 directly corresponds with the lead-out regions 514, the cap region 520 may be precisely aligned with the lead-out region 514, such that the cap region 520 is immediately adjacent to, but does not overlap, the lead-out region. Removing the photoresist cap mask from the cap fabrication process enables a more accurate alignment of the cap region 520 and the lead-out region 514 while eliminating additional fabrication steps.

Figure 6:
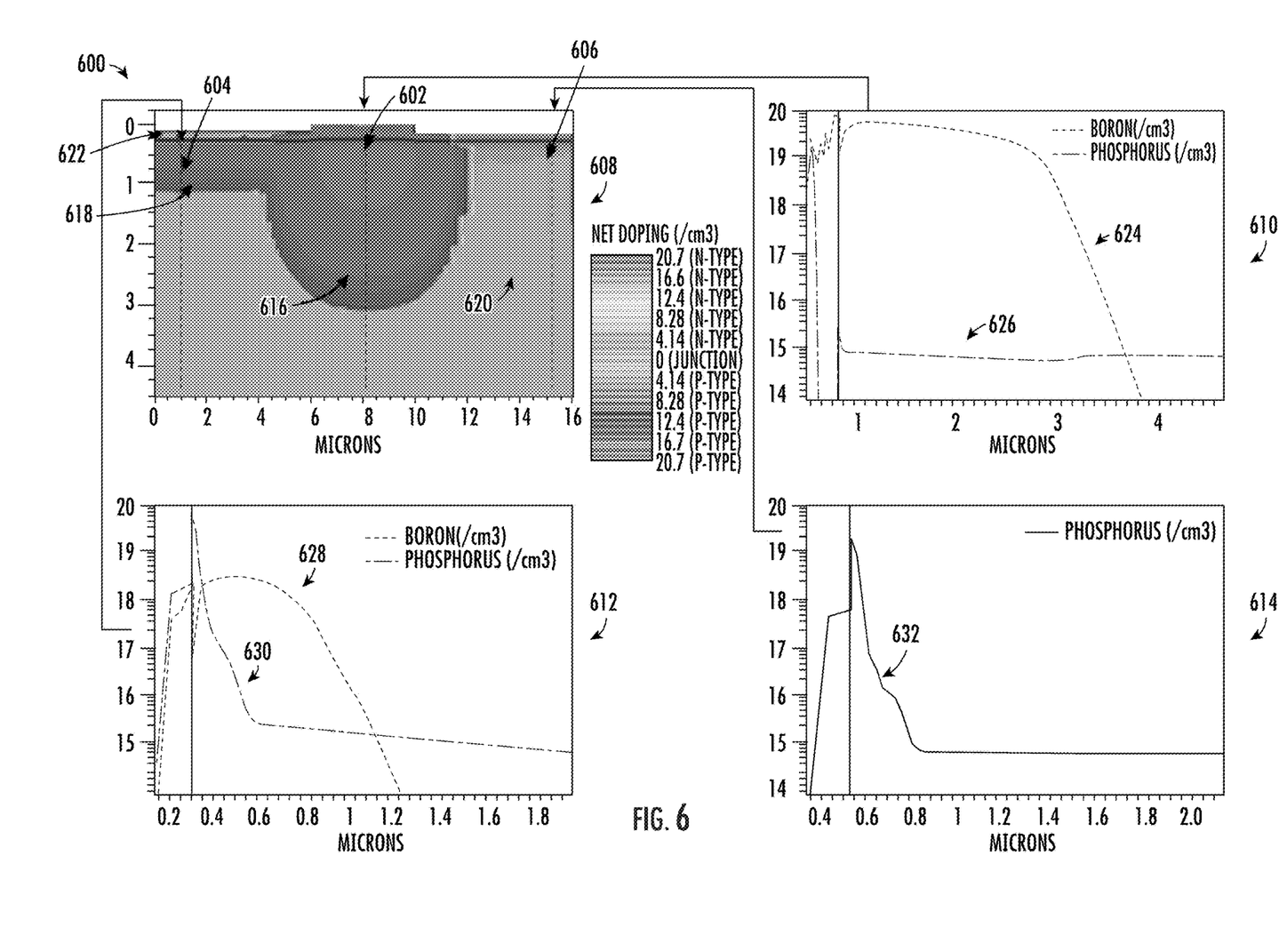
FIG. 6 depicts a series of graphs illustrating concentrations of various dopants as a function of depth at various points on the semiconductor structure in accordance with an example embodiment of the present disclosure.

Referring now to FIG. 6, a series of graphs 600 are provided, illustrating the concentration levels of Phosphorus (n-type) and Boron (p-type) through and around an electrical component (e.g., electrical component 218, electrical component 318, electrical component 518). As depicted in the series of graphs 600, the cap region (e.g., cap region 220, cap region 320, cap region 520) and the doped substrate (e.g., doped substrate 206, doped substrate 306, doped substrate 506) are both n-type semiconductors (e.g., created with a Phosphorus doping agent), while the electrical component and lead-out regions (e.g., lead-out regions 214, lead-out regions 314, lead-out regions 514) are created using a p-type doping agent (e.g., Boron), however, in some embodiments, the cap region and the doped substrate may be p-type semiconductors and the electrical components and the lead-out regions may be n-type semiconductors.

The graph 608 depicts the net doping of the semiconductor at each point in the cross section of an electrical component 618, a lead-out region 616, and the surrounding doped substrate 620. The net doping accounts for the overall doping of a particular region, considering both the effects of p-type and n-type doping. For example, if a region was doped with equal concentrations of an n-type doping agent and a p-type doping agent, the net doping would be at or near 0. As depicted in the graph 608, the net doping measurements around the lead-out region 616 are very high p-type from the surface of the semiconductor structure and down through the depth of the lead-out region 616. However, around the electrical component 618, the net doping at the surface of the semiconductor structure is n-type, while the net doping within the electrical component 618 is p-type. The n-type net doping measurement near the surface may be due to the cap region 622 near the surface of the semiconductor structure.

The graph 610 depicts the individual doping measurements of Boron (p-type) and Phosphorus (n-type) as a function of the depth within the semiconductor structure. The graph 610 depicts the individual doping measurements at the line 602, corresponding with the lead-out region 616 of the semiconductor structure. As shown in the graph 610, the p-type concentration 624 is high from the surface of the semiconductor structure, down until the lead-out region 616 terminates. However, the Phosphorus, or n-type concentration 628, is very low throughout the structure. The graph 610 illustrates the absence of an n-type cap region (e.g., cap region 622) at the surface of the lead-out region 616.

The graph 612 depicts the individual doping measurements of Boron (p-type) 628 and Phosphorus (n-type) 630 as a function of the depth within the semiconductor structure at the line 604, corresponding with the electrical component 618 region of the semiconductor structure. As shown in the graph 612, the p-type concentration is fairly high from the surface of the semiconductor structure until the electrical component 618 terminates. However, the n-type concentration 630 is very high near the surface of the semiconductor structure but dissipates quickly as the graph depicts further depths in the semiconductor structure. The graph 612 illustrates the presence of an n-type cap region 622 at the surface of the semiconductor structure coinciding with the electrical component 618.

The graph 614 depicts the individual doping measurements of Phosphorus (n-type) 632 as a function of the depth within the semiconductor structure at the line 606, corresponding with the doped substrate of the semiconductor structure. As depicted in graph 614, the n-type concentration 632 is high near the surface of the semiconductor structure but dissipates to a consistent low level as the graph depicts concentrations deeper within the semiconductor structure. The graph 614 illustrates the presence of an n-type cap region 622 across regions of the semiconductor structure that do not contain electrical components, for example, the doped substrate.

Figure 7:
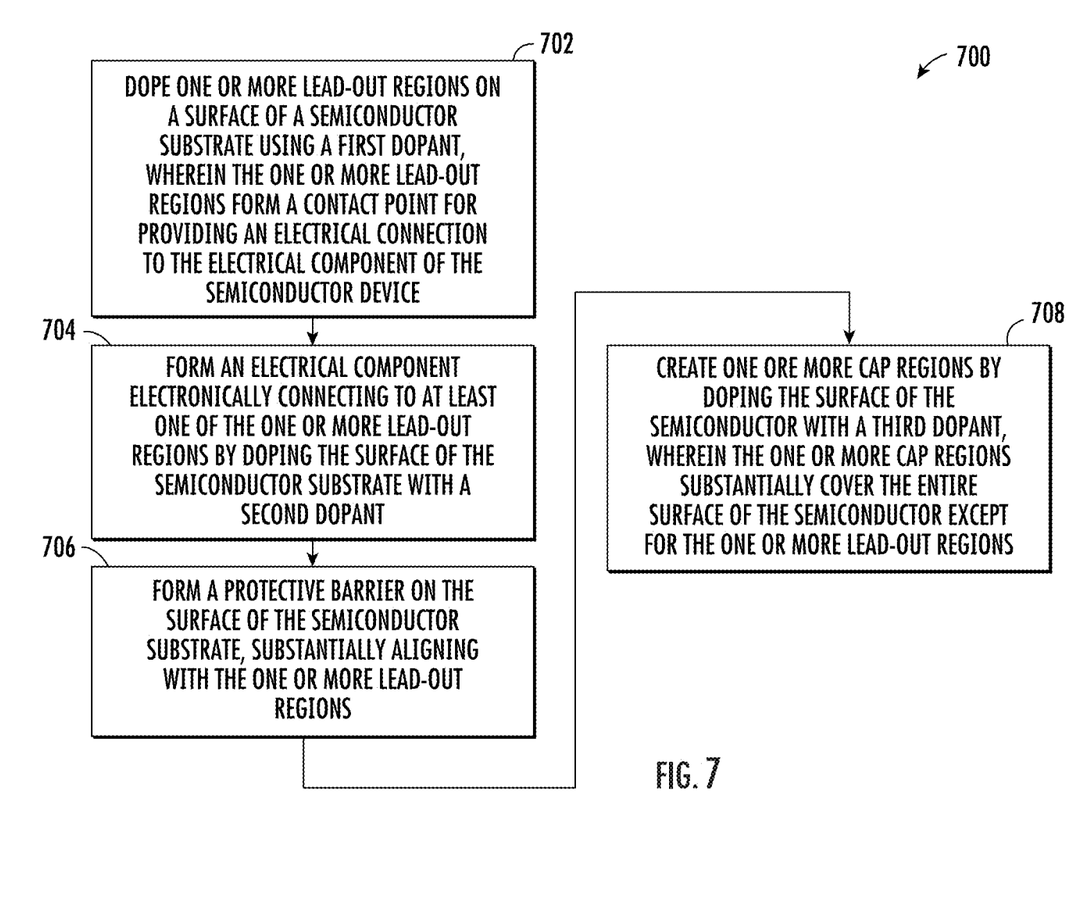
FIG. 7 depicts a flowchart illustrating an example method for fabricating a cap layer to protect electrical components of a semiconductor device in accordance with an example embodiment of the present disclosure.

Referring now to FIG. 7, a flowchart illustrating an example process 700 for fabricating a protective layer on a semiconductor device is provided. As depicted in FIG. 7, the fabrication process 700 begins at step 702 by doping one or more lead-out regions (e.g., lead-out region 214, lead-out region 314, lead-out region 514) on a surface of a semiconductor substrate (e.g., doped substrate 206, doped substrate 306, doped substrate 506) using a first dopant, wherein the one or more lead-out regions form a contact point for providing an electrical connection to the electrical component (e.g., electrical component 218, electrical component 318, electrical component 518) of the semiconductor device. As described in relation to FIG. 2, a lead-out region may be any region in a semiconductor device providing an electrical connection from the surface of the semiconductor device and/or an electrical contact pad (e.g., electrical contact 112) to one or more electrical components (e.g., a piezoresistor, a resistor, a variable resistor, a capacitor, a diode, a bridge, or other similar component). In some embodiments, the first dopant may be a dopant of a type opposite the type of the doped substrate. For example, if the semiconductor substrate is doped with an n-type dopant, the first dopant used to define the lead-out region may be a p-type dopant. In some embodiments, the lead-out region may be heavily doped (e.g., first concentration of doping agent) to reduce the resistance in the lead-out region. In some embodiments, the lead-out region may be doped using ion implantation and/or diffusion processes.

The example fabrication process 700 continues at step 704 by heating the one or more lead-out regions at a first temperature, wherein the first dopant penetrates from the surface of the semiconductor substrate deeper into the semiconductor substrate. In some embodiments, a drive-in process may be utilized to increase the penetration of the dopant agent into the semiconductor substrate. For example, after doping the lead-out regions using ion implantation and/or diffusion, the semiconductor substrate, including the doped lead-out regions, may be exposed to heat for a period of time. Exposure to heat may force the doping agent to drive from the surface of the semiconductor substrate deeper into the semiconductor substrate. As described in relation to FIG. 3, in some embodiments, the lead-out regions of the semiconductor substrate may be heated at a temperature between 1100° C. and 1250° C.; more preferably between 1125° C. and 1225° C.; most preferably between 1150° C. and 1200° C. In some embodiments, the lead-out regions of the semiconductor substrate may be heated for a duration between 30 minutes and 70 minutes; more preferably between 35 minutes and 65 minutes; most preferably between 40 minutes and 60 minutes.

The example fabrication process 700 continues at step 706 by forming an electrical component electrically connecting to at least one of the one or more lead-out regions by doping the surface of the semiconductor substrate with a second dopant. As described in relation to FIG. 2, an electrical component may be any component of an electrical device formed within the semiconductor substrate. For example, an electrical component may be a piezoresistor, a resistor, a variable resistor, a capacitor, a diode, a bridge, and/or other similar components of an electrical device. In some embodiments, for example when an electrical component comprises a piezoresistor, force or strain applied to the surface of the semiconductor device may change the electrical properties of the electrical component, such as the resistance. An electrical device (e.g., pressure sensor) may measure the change in the electrical properties to determine a physical characteristic of the surrounding environment. An electrical component may be electrically connected to one or more lead-out regions, such that an electric current applied to a lead-out region may flow through the lead-out region and through the electrical component. Similar to the lead-out regions, an electrical component may be defined, in some embodiments, by doping processes, such as ion implantation and/or diffusion. In some embodiments, the second dopant may be a doping agent of the same type as the lead-out region. For example, the lead-out region may be doped with a p-type dopant, such as Boron, and the electrical component may also be doped with a p-type dopant, such as Boron. In some embodiments, the doping concentration (e.g., second concentration) of the electrical component may be less than the doping concentration of the lead-out regions.

The example fabrication process 700 continues at step 708 by heating the electrical component at a second temperature wherein the second dopant penetrates from the surface of the semiconductor substrate deeper into the semiconductor substrate. Similar to the drive-in process described in relation to step 704, a drive-in process may be utilized to increase the penetration of the dopant agent defining the electrical component into the semiconductor substrate. For example, after doping the electrical component using ion implantation and/or diffusion, the semiconductor substrate, including the doped electrical component regions, may be exposed to heat for a period of time. Exposure to heat may force the doping agent to drive from the surface of the semiconductor substrate deeper into the semiconductor substrate. As described in relation to FIG. 3, in some embodiments, the electrical component regions of the semiconductor substrate may be heated at a temperature between 1000° C. and 1200° C.; more preferably between 1025° C. and 1175° C.; most preferably between 1050° C. and 1150° C. In some embodiments, the semiconductor substrate may be heated for a duration between 25 minutes and 55 minutes; more preferably between 30 minutes and 50 minutes; most preferably between 35 minutes and 45 minutes.

The example fabrication process 700 continues at step 710 by forming a protective barrier on the surface of the semiconductor substrate, substantially aligning with the one or more lead-out regions. As described in relation to FIG. 2, in some embodiments, forming a protective barrier may include utilizing photolithography techniques to form a photoresist mask, such as photoresist cap mask 222 and photoresist cap mask 322. A photoresist mask may prevent regions of the surface of the semiconductor substrate from receiving doping agents during a doping process. A photoresist mask providing a protective barrier to the one or more lead-out regions may be substantially aligned with the lead-out regions, such that doping agents applied during a subsequent doping process are not received by the lead-out regions. In some embodiments, the protective barrier substantially covers the lead-out regions while leaving the rest of the surface of the semiconductor substrate exposed to receive doping agents in a subsequent doping process.

In some embodiments, such as depicted in relation to FIG. 5, the protective barrier may be created through an oxide growth process. For example, as shown in FIG. 5, a silicon nitride film may be applied to the entire surface of the semiconductor substrate, except immediately above the lead-out regions. Once the lead-out regions are defined through a doping process, an oxidation growth process may be performed. Since the oxide layer may not be grown on the silicon nitride film, the oxide will only grow on the regions immediately above the lead-out regions. The oxide layer may provide a protective barrier from subsequent doping processes.

The example fabrication process 700 continues at step 712 by creating one or more cap regions by doping the surface of the semiconductor with a third dopant, wherein the one or more cap regions substantially cover the entire surface of the semiconductor except for the one or more lead-out regions. With the protective barrier in place, the semiconductor substrate may be exposed to a doping process to form a cap region, or doped layer, across the entire surface of the semiconductor substrate, except for those regions protected by a protective barrier (e.g., the lead-out regions). In some embodiments, the cap region may be fabricated using doping agents of a type opposite the doping type of the electrical components and the lead-out regions. For example, if the electrical components and the lead-out regions are fabricated using p-type doping agents, the cap region may be fabricated using n-type doping agents. In some embodiments, a cap region may fabricated through doping techniques, such as ion implantation and/or diffusion. The doping techniques may create a layer of doped semiconductor across the entire surface of the semiconductor device, except on the lead-out regions. The cap region may intercept the charged atoms detached during a sterilization process, such as e-beam irradiation, preventing charge build-up in and around the electrical components. In addition, the cap region may be prevented from overlapping with the lead-out regions by the protective barrier of step 710, preserving the high carrier concentration of the lead-out regions. Fabricating a cap region across the surface of the semiconductor device enables medical sterilization techniques such as e-beam irradiation to be performed while still maintaining the precise electrical properties of the electrical components disposed on the semiconductor device and maintain the high conductivity of the lead-out regions.

Many modifications and other embodiments of the inventions set forth herein will come to mind to one skilled in the art to which these inventions pertain having the benefit of teachings presented in the foregoing descriptions and the associated drawings. Although the figures only show certain components of the apparatus and systems described herein, it is understood that various other components may be used in conjunction with the system. Therefore, it is to be understood that the inventions are not to be limited to the specific embodiments disclosed and that modifications and other embodiments are intended to be included within the scope of the appended claims. Moreover, the steps in the method described above may not necessarily occur in the order depicted in the accompanying diagrams, and in some cases one or more of the steps depicted may occur substantially simultaneously, or additional steps may be involved. Although specific terms are employed herein, they are used in a generic and descriptive sense only and not for purposes of limitation.

While various embodiments in accordance with the principles disclosed herein have been shown and described above, modifications thereof may be made by one skilled in the art without departing from the spirit and the teachings of the disclosure. The embodiments described herein are representative only and are not intended to be limiting. Many variations, combinations, and modifications are possible and are within the scope of the disclosure. Alternative embodiments that result from combining, integrating, and/or omitting features of the embodiment(s) are also within the scope of the disclosure. Accordingly, the scope of protection is not limited by the description set out above.

Additionally, the section headings used herein are provided for consistency with the suggestions under 37 C.F.R. 1.77 or to otherwise provide organizational cues. These headings shall not limit or characterize the invention(s) set out in any claims that may issue from this disclosure.

Use of broader terms such as "comprises," "includes," and "having" should be understood to provide support for narrower terms such as "consisting of," "consisting essentially of" and "comprised substantially of." Use of the terms "optionally," "may," "might," "possibly," and the like with respect to any element of an embodiment means that the element is not required, or alternatively, the element is required, both alternatives being within the scope of the embodiment(s). Also, references to examples are merely provided for illustrative purposes, and are not intended to be exclusive.

The invention claimed is:

1. A fabrication method for protecting an electrical component of a semiconductor device, the method comprising:
doping one or more lead-out regions on a surface of a semiconductor substrate using a first dopant, wherein the one or more lead-out regions form a contact point for providing an electrical connection to the electrical component of the semiconductor device;
forming the electrical component electrically connecting to at least one of the one or more lead-out regions by doping the surface of the semiconductor substrate with a second dopant, forming a protective barrier on the surface of the semiconductor substrate, substantially aligning with the one or more lead-out regions;

creating one or more cap regions by doping the surface of the semiconductor substrate with a third dopant, wherein the one or more cap regions substantially cover an entire surface of the semiconductor substrate except for the one or more lead-out regions; and depositing a non-oxidizing film on the surface of the semiconductor substrate, wherein the non-oxidizing film substantially covers the surface of the semiconductor device, except for the one or more lead-out regions, and wherein the non-oxidizing film prevents the protective barrier from forming on the surface of the non-oxidizing film.

2. The method of claim 1, wherein the electrical component is a piezoresistor, and wherein a resistance of the piezoresistor changes when the surface of the semiconductor substrate is strained.

3. The method of claim 2, wherein the semiconductor device further comprises a plurality of electrical components arranged in a Wheatstone bridge circuit.

4. The method of claim 1, wherein the semiconductor device further comprises a plurality of electrical components, wherein at least one of the plurality of electrical components is a bridge.

5. The method of claim 1, further comprising:
heating the one or more lead-out regions at a first temperature,
wherein the first dopant penetrates from the surface of the semiconductor substrate deeper into the semiconductor substrate; and
heating the electrical component at a second temperature wherein the second dopant penetrates from the surface of the semiconductor substrate deeper into the semiconductor substrate.

6. The method of claim 1, wherein doping the surface of the semiconductor substrate comprises at least one of ion implantation and/or diffusion.

7. The method of claim 1, wherein the first and second dopants are of the same type.

8. The method of claim 7, wherein the first and second dopants are p-type dopants.

9. The method of claim 8, wherein the first and second dopants are one of boron or gallium.

10. The method of claim 1, wherein the one or more lead-out regions are doped at a first concentration and the electrical component is doped at a second concentration, and wherein the first concentration is greater than the second concentration.

11. The method of claim 1, wherein the third dopant is of a different type than the first and second dopant.

12. The method of claim 11, wherein the third dopant is an n-type dopant.

13. The method of claim 12, wherein the third dopant is phosphorus or arsenic.

14. The method of claim 1, wherein forming the protective barrier further comprises:
applying a layer of photoresist material to the surface of the semiconductor device;
exposing the layer of photoresist material using a photomask that substantially aligns with the one or more lead-out regions; and
removing the layer of photoresist material from all regions of the surface of the semiconductor device except for the regions of the layer of photoresist material contacting the surface of the one or more lead-out regions.

15. The method of claim 1, wherein the one or more cap regions do not substantially overlap with any one of the one or more lead-out regions.

16. The method of claim 1, wherein the semiconductor substrate further comprises an insulating layer, and wherein the insulating layer separated the semiconductor substrate from a semiconductor base.

17. The method of claim 1, wherein the non-oxidizing film prevents oxide from forming on the surface of the non-oxidizing film.

18. The method of claim 1, wherein the non-oxidizing film comprises silicon nitride.

19. The method of claim 1, wherein the non-oxidizing film is defined coincident with forming a photoresist lead-out mask.

* * * * *